United States Patent [19]

Cosquer et al.

[11] Patent Number: 5,566,040
[45] Date of Patent: Oct. 15, 1996

[54] PROTECTION ARRANGEMENT FOR AN ELECTRONIC DEVICE SENSITIVE TO ELECTROMAGNETIC RADIATION

[75] Inventors: Jean M. Cosquer, Saint Denis; Alain J. Fabre, Levallois; Robert Poirier, Taverny, all of France

[73] Assignee: Societe Nationale d'Etude et de Construction de Moteurs D'Aviation, Paris, France

[21] Appl. No.: 441,732

[22] Filed: May 16, 1995

[30] Foreign Application Priority Data

May 18, 1994 [FR] France .................................. 94 06047

[51] Int. Cl.⁶ ..................................................... H02H 1/00
[52] U.S. Cl. .......................... 361/113; 361/107; 361/119; 361/58
[58] Field of Search ...................... 361/113, 111, 361/118, 91, 56, 58, 107, 119, 800, 816; 307/97, 91, 104

[56] References Cited

U.S. PATENT DOCUMENTS 4,739,453  4/1988  Kurokawa ................................ 361/424
4,945,323  7/1990  Gerstenberg ............................. 333/185

FOREIGN PATENT DOCUMENTS 0534372  3/1993  European Pat. Off. ......... H05H 9/00
2101811  1/1983  United Kingdom ............. H05H 9/00

*Primary Examiner*—Jeffrey A. Gaffin
*Assistant Examiner*—Stephen W. Jackson
*Attorney, Agent, or Firm*—Oblon, Spivak, McClelland, Maier & Neustadt, P.C.

[57] ABSTRACT

A protection arrangement for an electronic device sensitive to electromagnetic radiation comprises a single printed circuit board which is disposed within a metal casing so that it passes perpendicularly through a metal partition separating an upstream zone in which electromagnetic fields prevail from a screened downstream zone, the board thus having a first part situated in the upstream zone and a second part, which is intended to carry the electronic device, situated in the downstream zone. Electrical signals are conveyed from the upstream zone to the downstream zone by means of conductive lines printed on at least one inner layer of the printed circuit board, and the board is provided with means for filtering the electrical signals comprising surface-mounted components in the vicinity of the metal partition and capacitive elements integrated in the printed circuit board where it passes through the partition.

6 Claims, 2 Drawing Sheets

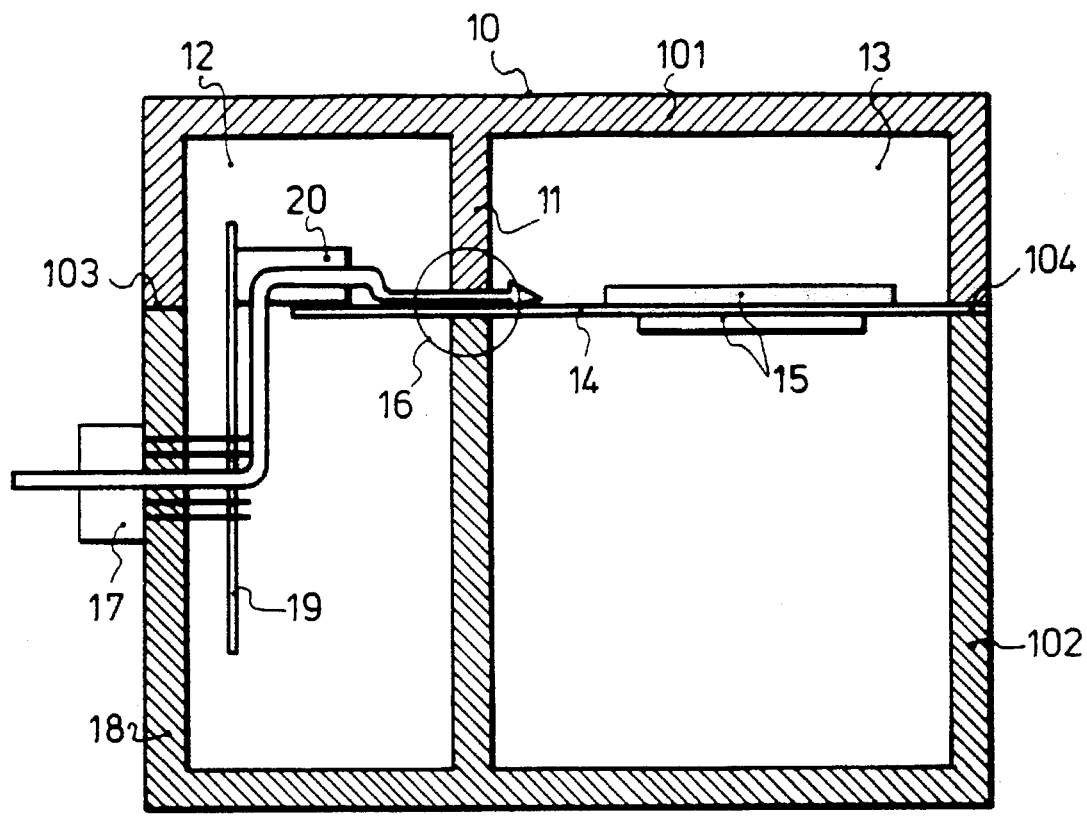
FIG:1
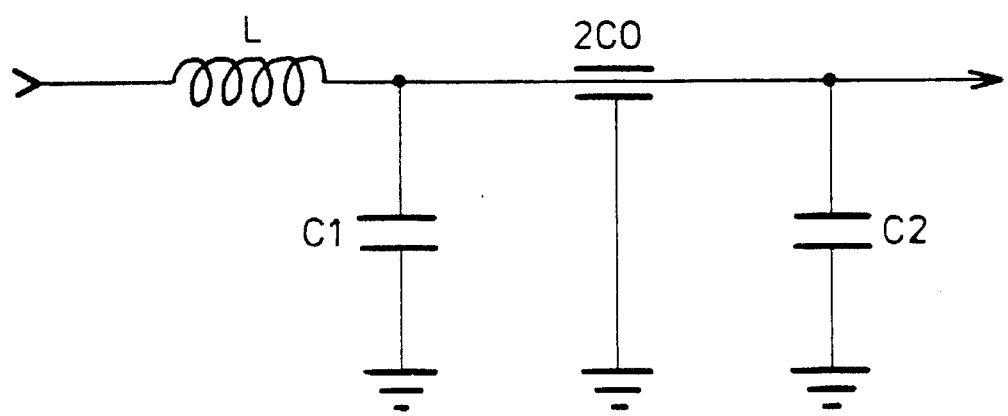
FIG:3

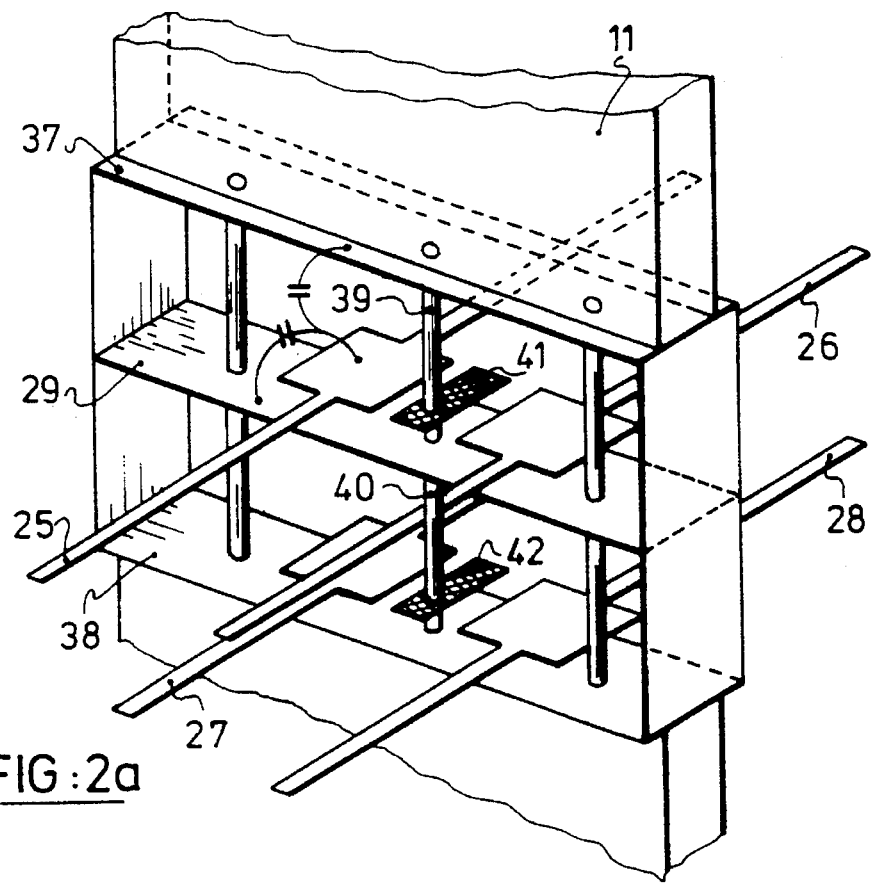
FIG:2a
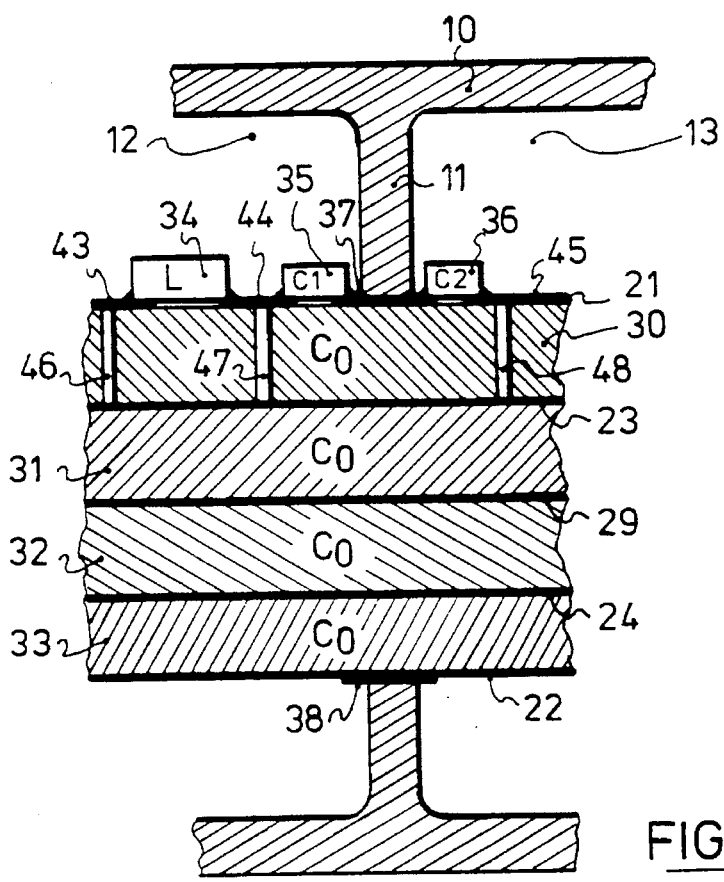
FIG:2b

PROTECTION ARRANGEMENT FOR AN ELECTRONIC DEVICE SENSITIVE TO ELECTROMAGNETIC RADIATION

BACKGROUND OF THE INVENTION

1. Field of the invention

The invention relates to a protection arrangement for an electronic device sensitive to electromagnetic radiation. The invention is applicable to any electronic device, but in particular to electronic computers carried on board an aircraft, for which cost and weight constraints are significant factors.

2. Summary of the prior art

To protect sensitive electronic devices against electromagnetic radiation, it is known to enclose them in screening metal casings and to filter the input/output signals. Generally, the filtering function is performed in a first zone of the casing separated by an internal partition from a second zone of the casing in which are housed the electronic circuits which correspond to the various functions of the electronic device.

The filtering function may be performed by means of discrete components screwed or welded through openings made in the internal metal partition. This solution is very costly, requires considerable assembly time and results in an excessive increase in the overall size and weight of the electronic device.

The filtering function may also be achieved by using a printed circuit dedicated to this function. This solution requires an additional board for performing the filtering function and additional connection means between the filter board and the board carrying the electronic device. However, connections between different printed circuits are awkward to implement, are costly, and increase the overall size of the electronic device.

SUMMARY OF THE INVENTION

It is an object of the invention to obviate the drawbacks of the known arrangements and to provide an efficient protection arrangement of smaller size and cost without increasing the number of internal connectors or the number of printed circuit boards.

For this purpose the invention uses only one printed circuit board on which are arranged the electronic device and means for filtering the electrical input/output signals of the electronic device. The printed circuit board is placed inside a metal casing and passes perpendicularly through an internal metal partition which separates an upstream zone, where electromagnetic fields prevail, from a screened downstream zone. The electrical input/output signals are conveyed from the upstream zone to the downstream zone by printed conductive lines on at least one inner layer of the printed circuit board. The filtering means for the electrical signals comprises surface-mounted components in the vicinity of the metal partition, and capacitive elements integrated in the printed circuit board where it passes through the partition. The integrated capacitive elements comprise a first plate constituted by a first conductive line, and a second plate constituted by a conductive surface connected to earthing means. This earthing connection is effected through contact between the conductive surface and the metal partition. Advantageously, the printed circuit board also comprises an inner conductive plane which is connected to the earthing means and which forms with each of the conductive lines additional capacitive elements where the board passes through the metal partition.

Thus, more particularly, the invention provides a protective arrangement for an electronic device sensitive to electromagnetic radiation, comprising a metal casing provided with an internal metal partition separating an upstream zone in which electromagnetic fields prevail and a screened downstream zone, said metal casing and said internal partition constituting earthing means, and a multilayer printed circuit board disposed inside said metal casing perpendicularly to said internal metal partition so that the board has a first part situated in said upstream zone and a second part, which is intended to carry said electronic device, situated in said downstream zone, said printed circuit board having at least one inner layer on which conductive lines are printed for conveying electrical signals from said upstream zone to said downstream zone, and means for filtering the electrical signals comprising capacitive elements integrated in said printed circuit board where it passes through said internal partition, said integrated capacitive elements comprising a first plate constituted by one of said conductive lines and a second plate constituted by a conductive surface connected to said earthing means by contact with said internal metal partition.

Other features and advantages of the invention will become apparent from the following description of the preferred embodiment, given by way of example only, with reference to the accompanying drawings.

BRIEF DESCRIPTION OF THE DRAWINGS

FIG. 1 is a diagrammatic sectional view of one embodiment of a protection arrangement comprising a metal casing, a printed circuit board and filtering means in accordance with the invention;

FIG. 2a is a detailed, partially cut-away perspective view of a filtering cell of the printed circuit board in the vicinity of the internal metal partition of the casing in the embodiment of FIG. 1;

FIG. 2b is a cross-section through the printed circuit board where it passes through the internal partition of the casing; and, FIG. 3 is a circuit diagram corresponding to a filtering cell as depicted in FIGS. 2a and 2b.

DESCRIPTION OF THE PREFERRED EMBODIMENT

With reference to FIG. 2, a metal casing 10 is constituted by at least two frames 101, 102 joined at joint planes 103, 104, and includes an internal metal partition 11 defining two zones 12, 13. The first zone is termed the upstream zone and contains electromagnetic fields, and the second zone 13 is termed the downstream zone and is screened. The casing 10 and the internal metal partition 11 constitute earthing means for the electronic assembly.

A multilayer printed circuit board 14, carrying an electronic device 15 and means 16 for filtering the input and output signals, is arranged inside the casing 10 perpendicularly to the internal metal partition 11. The printed circuit board 14 is clamped across its entire width by the internal metal partition 11, and thus has a first part situated in the upstream zone 12 and a second part, which carries the electronic device 15, situated in the screened downstream zone 13. In this way, the electronic device is disposed entirely within the screened zone 13. The filtering means 16, which is described in detail with reference to FIGS. 2a, 2b and 3, is disposed in the vicinity of the internal metal partition 11.

The electrical input/output connections are effected by means of an external electrical connector 17 fixed on a front face 18 of the metal casing. The electrical signals are thereafter guided by conductive tracks printed on an intermediate board 19 to an internal connector 20 carried by the intermediate board 19 and providing electrical connections with conductive tracks of the multilayer printed circuit board 14. The intermediate board 19 and the internal connector 20 are located in the upstream zone 12 of the casing. FIGS. 2a and 2b show two detailed views, in perspective and in section respectively, of the printed circuit board 14 in the vicinity of the metal partition 11, showing one example of a filtering cell in accordance with the invention.

The printed circuit board comprises two outer faces 21, 22 having conductive tracks on which electronic components are mounted, and inner layers 23, 24 including conductive lines 25, 26, 27, 28 for conveying electrical input/output signals from the upstream zone 12 to the downstream zone 13. An internal earthing plane 29 connected to the earthing means of the electromagnetic assembly is arranged between the two successive inner layers 23, 24. The internal earthing plane 29 is constituted by a conductive layer extending over the whole area of the printed circuit board and effects a separation of the signals conveyed on the two successive layers 23, 24. The various layers 21, 23, 29, 24, 22 of the printed circuit board are electrically insulated from eachother by insulating layers 30, 31, 32, 33 of a dielectric material. The various conductive tracks and the inner earthing plane 29 may be made, for example, of copper; and the dielectric material may be, for example, polyimide.

The electrical input/output signals are decoupled by means of filtering cells associated with each conductive line in the vicinity of the metal partition 11.

Each filtering cell comprises components 34, 35, 36 which are surface-mounted on an outer face of the printed circuit board, and two capacitive elements which are integrated in the thickness of the printed circuit board under the metal partition 11. Each integrated capacitive element comprises a plate constituted by a conductive surface connected to the earthing means and a plate constituted by the conductive line 25, 26, 27, 28 conveying the signal to be decoupled.

For one of the integrated capacitors, the plate connected to the earthing means is constituted by the inner earthing plane 29. For the other integrated capacitor, the plate connected to the earthing means is constituted by a conductive surface 37, 38 located on one of the outer faces of the printed circuit board, under the metal partition 11. Earthing is effected through contact with the partition 11. To increase the capacitance effect, the conductive lines 25, 26, 27, 28 are widened where they pass through the metal partition 11.

At the passage through the metal partition, the separation between two signals conveyed by two adjacent conductive lines situated on the same inner layer as eachother is ensured by metallized holes 39, 40 through the thickness of the printed circuit board and connected to the earthing means, each metallized hole being located between the two conductive lines and being associated with a conductive strip 41, 42 situated on the same layer as the said two lines. This configuration ensures weak crosstalk and a lowering of earthing impedance.

FIG. 3 shows a circuit diagram corresponding to the filtering cell of FIG. 2b.

The inductance L and the capacitors C1 and C2 are surface-mounted components connected to conductive surfaces 43, 44, 45, 37. The conductive surfaces 43, 44, 45 are connected by means of metallized holes 46, 47, 48 to the conductive line to be decoupled, and the conductive surface 37 is clamped by the metal partition 11 which thus effects the earthing of this surface 37. The capacitances CO are capacitances passing through the partition 11 in parallel and are equivalent to a single capacitance of value 2 CO.

The present invention is, of course, not limited to the embodiment as just described. In particular, the printed circuit board may have a different number of layers and conductive lines according to the number of electrical signals to be conveyed. Furthermore, the filtering cells may comprise a different number of components mounted on the surface, it being possible to arrange these components in a variety of configurations.

We claim:

1. A protective arrangement for an electronic device sensitive to electromagnetic radiation, comprising a metal casing provided with an internal metal partition separating an upstream zone in which electromagnetic fields prevail and a screened downstream zone, said metal casing and said internal partition constituting earthing means, and a multilayer printed circuit board disposed inside said metal casing perpendicularly to said internal metal partition so that the board has a first part situated in said upstream zone and a second part, which is intended to carry said electronic device, situated in said downstream zone, said printed circuit board having at least one inner layer on which conductive lines are printed for conveying electrical signals from said upstream zone to said downstream zone, and means for filtering the electrical signals comprising capacitive elements integrated in said printed circuit board where it passes through said internal partition, said integrated capacitive elements comprising a first plate constituted by one of said conductive lines and a second plate constituted by a conductive surface connected to said earthing means by contact with said internal metal partition.

2. A protection arrangement according to claim 1, wherein said multilayer printed circuit board also includes at least one further inner layer constituted by an inner conducting plane connected to said earthing means, said conducting plane forming with each of said conductive lines additional capacitive elements integrated in said printed circuit board where it passes through said internal metal partition.

3. A protection arrangement according to claim 1, wherein said conductive lines are widened where they pass through said internal metal partition so as to increase the capacitive effect.

4. A protection arrangement according to claim 1, wherein said printed circuit board comprises two inner layers on which said conductive lines are printed for conveying electrical signals from said upstream zone to said downstream zone, and an inner conductor plane disposed between said two inner layers, said conductor plane being connected to said earthing means.

5. A protection arrangement according to claim 1, wherein said filtering means further comprises surface-mounted components sited on at least one outer face of said printed circuit board the vicinity of said internal partition.

6. A protection arrangement according to claim 5, wherein said printed circuit board is provided with metallized holes through the thickness of the board where it passes through said metal partition, said metallized holes being connected to said earthing means, and each of said metallized holes being located at a position between two successive conductive lines disposed on the same inner layer as each other and being associated with a conductive strip disposed on the same inner layer as said two conductive lines.

* * * * *

UNITED STATES PATENT AND TRADEMARK OFFICE
CERTIFICATE OF CORRECTION

PATENT NO. : 5,566,040
DATED : October 15, 1996
INVENTOR(S) : COSQUER et al.

It is certified that error appears in the above-indentified patent and that said Letters Patent is hereby corrected as shown below:

In column 4, line 61, after "circuit board" insert --in--.

Signed and Sealed this

Twenty-second Day of April, 1997

BRUCE LEHMAN

*Commissioner of Patents and Trademarks*

*Attest:*

*Attesting Officer*